United States Patent
Inoue et al.

(10) Patent No.: US 10,489,243 B2
(45) Date of Patent: Nov. 26, 2019

(54) MEMORY CONTROLLER AND MEMORY SYSTEM

(71) Applicant: Toshiba Memory Corporation, Minato-ku, Tokyo (JP)

(72) Inventors: Kazuki Inoue, Kawasaki Kanagawa (JP); Sho Kodama, Kawasaki Kanagawa (JP); Keiri Nakanishi, Kawasaki Kanagawa (JP); Kohei Oikawa, Tokyo (JP); Youhei Fukazawa, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 139 days.

(21) Appl. No.: 15/705,877

(22) Filed: Sep. 15, 2017

(65) Prior Publication Data
US 2018/0260274 A1 Sep. 13, 2018

Related U.S. Application Data

(60) Provisional application No. 62/470,417, filed on Mar. 13, 2017.

(51) Int. Cl.
*G06F 11/10* (2006.01)
*G06F 3/06* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC ............. G06F 11/1016; G06F 11/1048; G06F 11/1068; G06F 3/0613; G06F 3/0619;
(Continued)

(56) References Cited

U.S. PATENT DOCUMENTS 9,110,827 B2  8/2015  Sakai et al.
2013/0117616 A1* 5/2013  Tai ...................... G06F 11/1048
                                                714/718
(Continued)

FOREIGN PATENT DOCUMENTS

JP  2007-104708 A  4/2007
JP  5870901 B2    3/2016

OTHER PUBLICATIONS

Shuhei Tanakamaru et al. "Highly Reliable and Low Power SSD Using Asymmetric Codling and Stripe Bitline-Pattern Elimination Programming", IEEE Journal of Solid-State Circuits, vol. 47, No. 1, 85-96, (Jan. 2012).

*Primary Examiner* — Shelly A Chase
(74) *Attorney, Agent, or Firm* — White & Case LLP

(57) ABSTRACT

According to one embodiment, for first data, which is read from a nonvolatile memory, for which a first data translation is performed, a second data translation that is a reverse translation of the first data translation is performed. Next, for the first data for which the second data translation is performed, the first data translation is performed. In addition, the read first data is compared with the first data for which the first data translation is performed, and check information is generated based on a result of the comparison.

20 Claims, 11 Drawing Sheets

(51) Int. Cl.
*G06F 12/10* (2016.01)
*G06F 12/02* (2006.01)
*G11C 29/52* (2006.01)

(52) U.S. Cl.
CPC .......... *G06F 3/0655* (2013.01); *G06F 3/0679* (2013.01); *G06F 11/1072* (2013.01); *G06F 12/0246* (2013.01); *G06F 12/10* (2013.01); *G06F 2212/1032* (2013.01); *G06F 2212/657* (2013.01); *G06F 2212/7201* (2013.01); *G11C 29/52* (2013.01)

(58) Field of Classification Search
CPC ...... G06F 3/0655; G06F 3/0679; G06F 12/10; G06F 12/0246
See application file for complete search history.

(56) References Cited

U.S. PATENT DOCUMENTS

| | | | |
|---|---|---|---|
| 2013/0166986 A1* | 6/2013 | Alrod | G06F 11/1048 714/755 |
| 2016/0283323 A1* | 9/2016 | Yeung | G06F 11/1016 |
| 2017/0109078 A1* | 4/2017 | Shaharabany | G06F 3/0613 |
| 2017/0147499 A1* | 5/2017 | Mohan | G06F 3/0616 |
| 2018/0004650 A1 | 1/2018 | Battaje et al. | |

* cited by examiner

FIG.5

| FLIP PATTERN (U/M/L) | | DATA AFTER CODING | FLAG FG |
|---|---|---|---|
| #1 | 0/0/0 | L3 L4 L2 L5 L1 L4 L6 L1 | L7 |
| #2 | 0/0/1 | L2 L5 L3 L4 Er L5 L7 Er | L6 |
| #3 | 0/1/0 | L1 L6 Er L7 L3 L6 L4 L3 | L5 |
| #4 | 0/1/1 | Er L7 L1 L6 L2 L7 L5 L2 | L4 |
| #5 | 1/0/0 | L7 Er L6 L1 L5 Er L2 L5 | L3 |
| #6 | 1/0/1 | L6 L1 L7 Er L4 L1 L3 L4 | L2 |
| #7 | 1/1/0 | L5 L2 L4 L3 L7 L2 Er L7 | L1 |
| #8 | 1/1/1 | L4 L3 L5 L2 L6 L3 L1 L6 | Er |

FIG.6

| FLIP PATTERN (U/M/L) | | DATA AFTER RECODING | FLAG FG |
|---|---|---|---|
| #11 | 0/0/0 | L2 L5 L3 L4 Er L5 L7 Er | L7 |
| #12 | 0/0/1 | L3 L4 L2 L5 L1 L4 L6 L1 | L6 |
| #13 | 0/1/0 | Er L7 L1 L6 L2 L7 L5 L2 | L5 |
| #14 | 0/1/1 | L1 L6 Er L7 L3 L6 L4 L3 | L4 |
| #15 | 1/0/0 | L6 L1 L7 Er L4 L1 L3 L4 | L3 |
| #16 | 1/0/1 | L7 Er L6 L1 L5 Er L2 L5 | L2 |
| #17 | 1/1/0 | L4 L3 L5 L2 L6 L3 L1 L6 | L1 |
| #18 | 1/1/1 | L5 L2 L4 L3 L7 L2 Er L7 | Er |

US 10,489,243 B2

MEMORY CONTROLLER AND MEMORY SYSTEM

CROSS-REFERENCE TO RELATED APPLICATIONS

This application is based upon and claims the benefit of priority from U.S. Provisional Application No. 62/470,417, filed on Mar. 13, 2017; the entire contents of which are incorporated herein by reference.

FIELD

Embodiments described herein relate generally to a memory controller controlling a nonvolatile memory and a memory system.

BACKGROUND

In flash memories, a threshold voltage of a cell changes according to wear of the cell, an inter-cell interference, data retention, or the like, and a bit error occurs at the time of reading data.

BRIEF DESCRIPTION OF THE DRAWINGS

FIG. 5 is a diagram that illustrates eight pieces of data-translated data;

FIG. 6 is a diagram that illustrates eight pieces of data-retranslated data;

DETAILED DESCRIPTION

In general, according to one embodiment, a memory controller controls a nonvolatile memory. The memory controller includes a read unit, a second data translation unit, a first data translation unit, and a check unit. The read unit reads first data from the nonvolatile memory. The first data is data for which a first data translation is performed. The second data translation unit performs a second data translation for the read first data. The second data translation is a reverse translation of the first data translation. The first data translation unit performs the first data translation for the first data for which the second data translation is performed. The check unit compares the read first data with the first data for which the first data translation is performed by the first data translation unit and generates check information based on a result of the comparison.

Exemplary embodiments of a memory controller and a memory system will be explained below in detail with reference to the accompanying drawings. The present invention is not limited to the following embodiments.

(First Embodiment)

Figure 1:
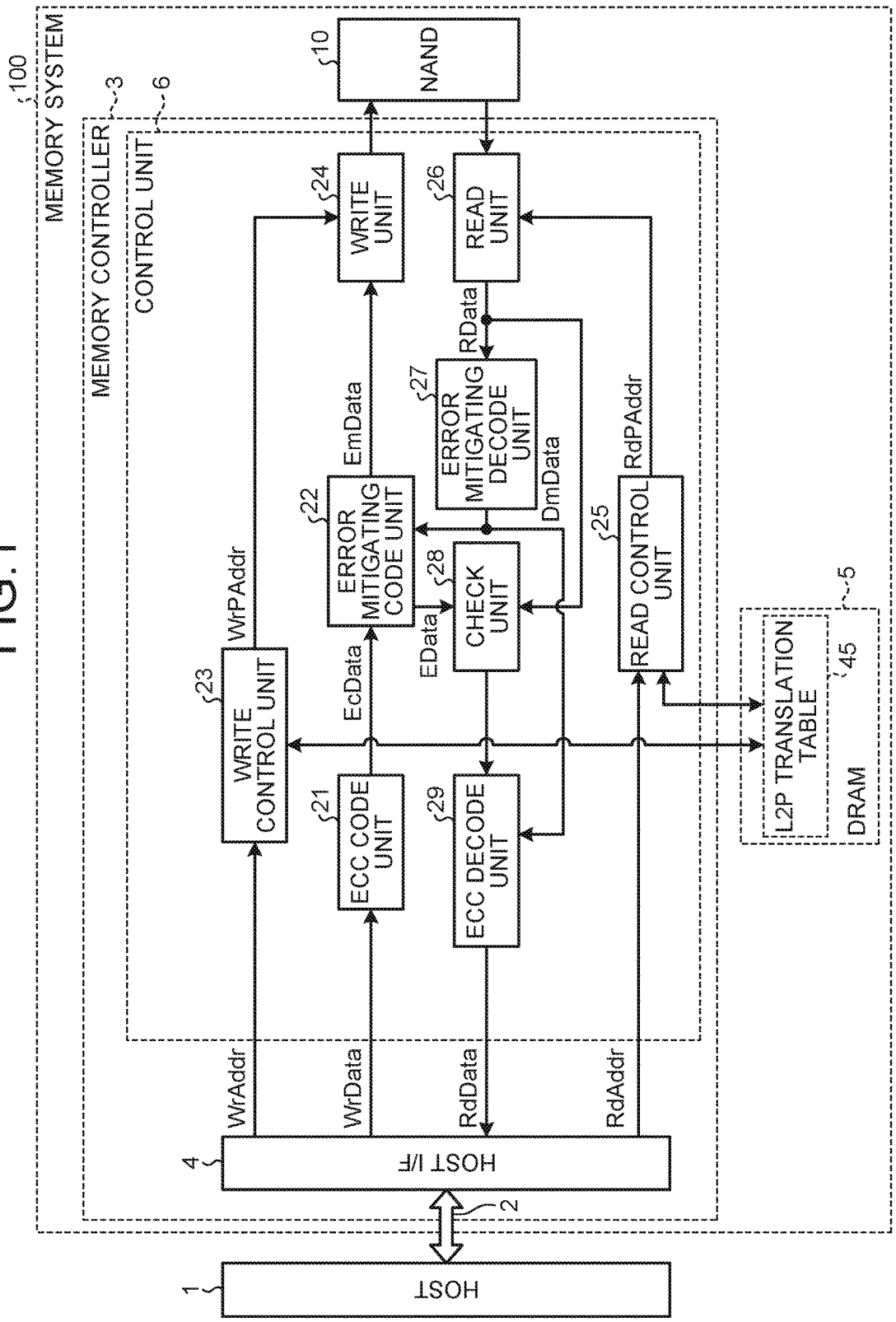
FIG. 1 is a functional block diagram that illustrates an example of the internal configuration of a memory system according to a first embodiment.

FIG. 1 is a block diagram that illustrates an example of the configuration of a memory system 100 according to a first embodiment. The memory system 100 is connected to a host apparatus 1 (hereinafter, abbreviated as a host) through a communication line 2 and functions as an external storage device of the host 1. The host 1, for example, may be an information processing apparatus such as a personal computer, a mobile phone, or an imaging apparatus and may be a mobile terminal such as a tablet computer or a smartphone.

The memory system 100 includes a NAND flash memory (hereinafter, abbreviated as a NAND) 10 as a nonvolatile memory, a dynamic random access memory (DRAM) 5, and a memory controller 3. The nonvolatile memory is not limited to the NAND flash memory but may be a three-dimensional structure flash memory, a resistance random access memory (ReRAM), a ferroelectric random access memory (FeRAM), or the like.

The NAND 10 includes one or more memory chips each including a memory cell array. The memory cell array includes a plurality of memory cells (hereinafter, referred to as cells) arranged in a matrix pattern. The memory cell array includes a plurality of blocks that are units for data erasing. Each block is configured by a plurality of physical sectors MS (see FIG. 2). The configuration of the memory cell array is not particularly limited, but the memory cell array may be a memory cell array having a two-dimensional structure, a memory cell array having a three-dimensional structure, or a memory cell array having any other structure.

Figure 2:
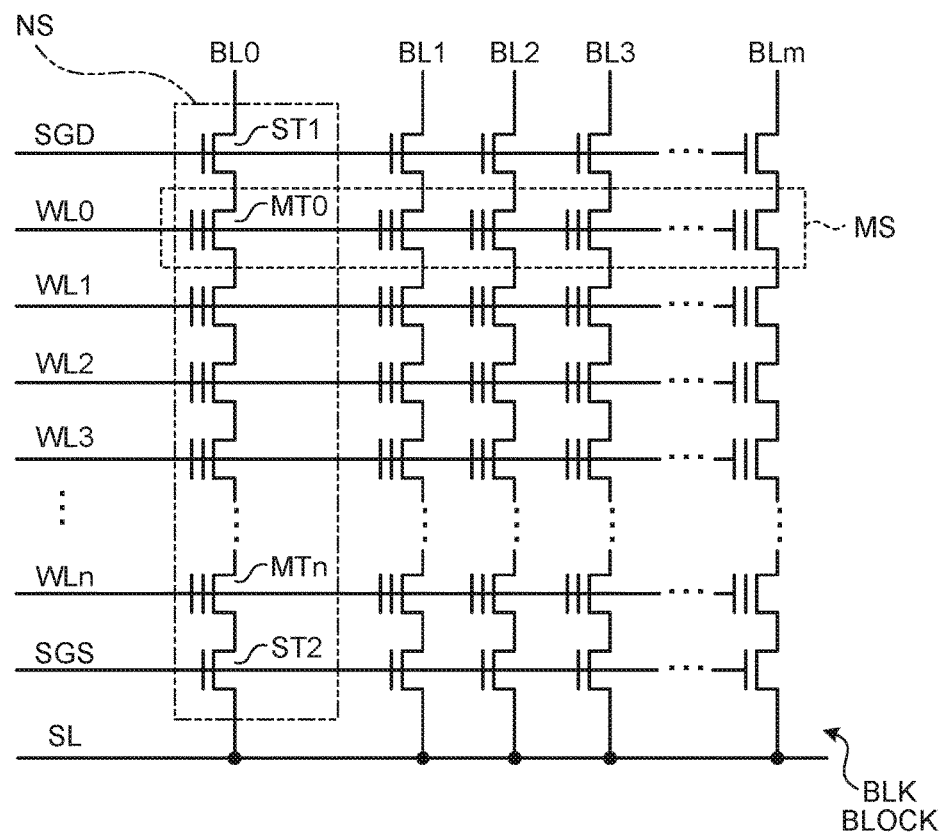
FIG. 2 is a diagram that illustrates an example of the circuit configuration of a memory cell array.

FIG. 2 is a diagram that illustrates an example of the configuration of a block of a memory cell array having a two-dimensional structure. FIG. 2 illustrates one block among a plurality of blocks configuring the memory cell array having the two-dimensional structure. Any other block has a configuration similar to that illustrated in FIG. 2. The block BLK of the memory cell array includes (m+1) (here, m is an integer of zero or more) NAND strings NS. Each NAND string NS includes: (n+1) (here, n is an integer of zero or more) cell transistors MT0 to MTn connected in series to share a diffusion area (a source region or a drain region) between cell transistors MT adjacent to each other; and selection transistors ST1 and ST2 arranged at both ends of the column of the cell transistors MT0 to MTn.

Word lines WL0 to WLn are connected to control gate electrodes of the cell transistors MT0 to MTn, respectively. In addition, cell transistors MTi (here, i=0 to n) are connected to be common using the same word line WLi (here, i=0 to n). In other words, the control gate electrodes of the cell transistors MTi disposed in the same row within the block BLK are connected to the same word line WLi.

Each of the cell transistors MT0 to MTn is configured by a field effect transistor having a stacked gate structure on a semiconductor substrate. Here, the stacked gate structure includes: a charge storage layer (floating gate electrode) formed on the semiconductor substrate with a gate insulating film interposed therebetween; and a control gate electrode formed on the charge storage layer with an inter-gate insulating film interposed therebetween. A threshold voltage of each of the cell transistors MT0 to MTn changes according to the number of electrons storable in the floating gate electrode and thus, the cell transistors can store data according to a difference in the threshold voltage.

Bit lines BL0 to BLm are respectively connected to the drains of (m+1) selection transistors ST1 within one block BLK, and a selection gate line SGD is connected to be common to the gates of the selection transistors. In addition, the source of the selection transistor ST1 is connected to the drain of the cell transistor MT0. Similarly, a source line SL is connected to be common to the sources of the (m+1) selection transistors ST2 within one block BLK, and a selection gate line SGS is connected to be common to the gates of the selection transistors. In addition, the drain of the selection transistor ST2 is connected to the source of the cell transistor MTn.

Each cell is connected not only to the word line but also to the bit line. Each cell can be identified by using an address used for identifying a word line and an address used for identifying a bit line. The data of cells (the cell transistors MT) disposed within the same block BLK is erased altogether. On the other hand, data is written and read in units of physical sectors MS. One physical sector MS includes a plurality of cells connected to one word line.

Each cell can perform multi-value storage. In a case where the cells are operated in a single level cell (SLC) mode, one physical sector MS corresponds to one page. On the other hand, in a case where the cells are operated in a multiple level cell (MLC) mode, one physical sector MS corresponds to two pages. In a case where the cells are operated in a triple level cell (TLC) mode, one physical sector MS corresponds to three pages. In a case where the cells are operated in a quadruple level cell (QLC) mode, one physical sector MS corresponds to four pages.

In a read operation and a program operation, one word line is selected according to the physical address, and one physical sector MS is selected. A switching of a page within this physical sector MS is performed using the physical address.

User data transmitted from the host 1, management information used for managing the user data, and the like are stored in the NAND 10. The management information includes a logical/physical translation table (L2P translation table). The management information, which includes the L2P translation table 45, stored in the NAND 10 is loaded into the DRAM 5 at the time of starting up or the like. The management information loaded into the DRAM 5 is backed up by the NAND 10.

The memory controller 3 includes a host interface 4 and a control unit 6. The DRAM 5 may be arranged inside the memory controller 3. The host I/F 4 performs a process according to an interface standard for the host 1 and outputs a command, user data (write data), and the like received from the host 1 to the control unit 6. In addition, the host I/F 4 transmits user data read from the NAND 10, a response from the control unit 6, and the like to the host 1.

The memory system 100 receives a write request and a read request from the host 1. The write request includes a write command, a write address WrAddr, and write data WrData. The read request includes a read command and a read address RdAddr. In a case where a write request is received, the host I/F 4 inputs a write command, a write address WrAddr, and write data WrData to the control unit 6. The control unit 6 writes the write data WrData in a physical address WrPAddr of the NAND 10 acquired by translating the write address WrAddr that is a logical address. In a case where a read request is received, the host I/F 4 inputs a read command and a read address RdAddr to the control unit 6. The control unit 6 reads data from a physical address RdPAddr of the NAND 10 acquired by translating the read address RdAddr that is a logical address. The control unit 6 transmits the read data to the host 1 through the host I/F 4.

The control unit 6 manages the user data by using the L2P translation table 45 loaded into the DRAM 5. In the L2P translation table 45, mapping associating a logical address WrAddr that can be designated by the host 1 and a physical address of the NAND 10 with each other is registered. As the logical address, for example, logical block addressing (LBA) is used. The physical address represents a storage position on the NAND 10 at which data is stored.

The control unit 6 performs management of blocks included in the NAND 10 by using a block management table (not illustrated in the drawing) that is one of the management information described above. The block management table, for example, manages the following block management information.

Erase count in units of blocks
Information used for identifying whether a block is an active block or a free block
Block address of a bad block In an active block, valid data is recorded. In a free block, valid data is not recorded. The free block can be reused as an erased block after erasing data thereof. The valid data is data associated with a logical address, and invalid data is data with which a logical address is not associated. When data is written into an erased block, the erased block becomes an active block. A bad block is an unusable block that does not normally operate due to various factors.

The control unit 6 includes: an ECC code unit 21, an error mitigating code unit 22; a write control unit 23; a write unit 24; a read control unit 25; a read unit 26; an error mitigating decode unit 27; a check unit 28; and an ECC decode unit 29. The function of each constituent element of the control unit 6, for example, is realized by one or a plurality of CPUs (processors) executing firmware loaded into the DRAM 5 and peripheral circuits.

Figure 3:
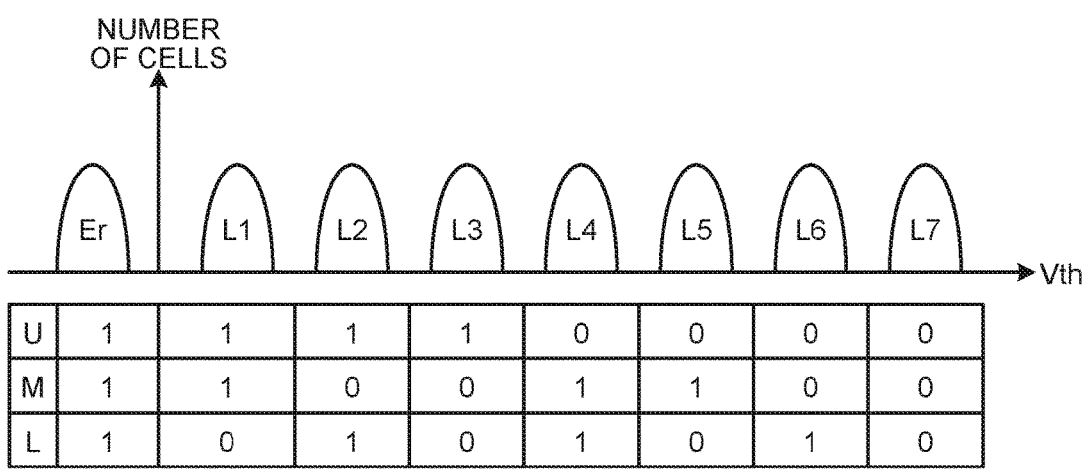
FIG. 3 is a diagram that illustrates an example of a threshold voltage distribution and data coding of a memory cell of three bits/cell.

FIG. 3 is a diagram that illustrates an example of a threshold voltage distribution and data coding of a memory cell of three bits/cell operating in a TLC mode. In an upper diagram illustrated in FIG. 3, the horizontal axis represents a threshold voltage Vth, and the vertical axis represents the number of cells. In the case of a memory cell of three bits/cell, there are eight distributions Er, L1, L2, L3, L4, L5, L6, and L7. The distribution Er has a lowest threshold voltage and corresponds to a threshold voltage distribution of an erased state. The threshold voltage becomes higher in order of the distribution L1, the distribution L2, and the distribution L3. The distribution L7 has a highest threshold voltage. Data values of three bits are respectively associated with the distributions Er and L1 to L7. This association is called data coding. This data coding is determined in advance. At the time of writing (programming) data, electric charge is injected into cells such that a threshold voltage distribution corresponding to a stored data value is formed in accordance with data coding. One physical sector corresponds to three pages. In this embodiment, these three pages will be referred to as a lower page, a middle page, and an upper page.

In FIG. 3, a lower diagram is a diagram that illustrates an example of data coding. "U" corresponds to the upper page, "M" corresponds to the middle page, and "L" corresponds to the lower page. The distribution Er corresponds to a data value "111", the distribution L1 corresponds to "110", the distribution L2 corresponds to "101", the distribution L3 corresponds to "100", the distribution L4 corresponds to "011", the distribution L5 corresponds to "010", the distribution L6 corresponds to "001", and the distribution L7 corresponds to "000". In this embodiment, data of the upper page is denoted by Du, data of the middle page is denoted by Dm, and data of the lower page is denoted by Dl, and the data value of three bits will be denoted as "DuDmDl". The data coding is not limited to the example illustrated in FIG. 3. A read voltage for the upper page is set between the distribution L3 and the distribution L4, and a read voltage for the middle page is set between the distribution L1 and the distribution L2, between the distribution L3 and the distribution L4, and between the distribution L5 and the distribution L6. A read voltage for the lower page is set between each of the distributions Er and L1 to L7.

Flash memories have such characteristics that, as the amount of electric charge injected into a cell increases, the degree of wear of the cell becomes higher, and the durability is degraded. Accordingly, in the case of the SLC mode, the durability of a cell is degraded more in the case of a logical value "0" (after injection of electric charge) than the case of a logical value "1" (erased state). In the case of the TLC mode (three bits/cell), the degree of wear of a cell is highest for the distribution L7 having a highest threshold voltage. This will be referred to as a first characteristic.

In addition, in flash memories, there are cases where an incorrect data value is read at the time of reading due to an inter-cell interference. As adjacent cells, the influence is highest in a case where the threshold voltage levels are equivalent to maximum-minimum-maximum or minimum-maximum-minimum. In the case of three bits/cell, the influence is highest in a case where the distributions are equivalent to the distribution L7—the distribution Er—the distribution L7 or the distribution Er—the distribution L7—the distribution Er. This will be referred to as a second characteristic.

In order to alleviate or prevent the influence according to the first characteristic and/or the second characteristic, an error mitigating code process is performed using the error mitigating code unit 22.

Figure 4:
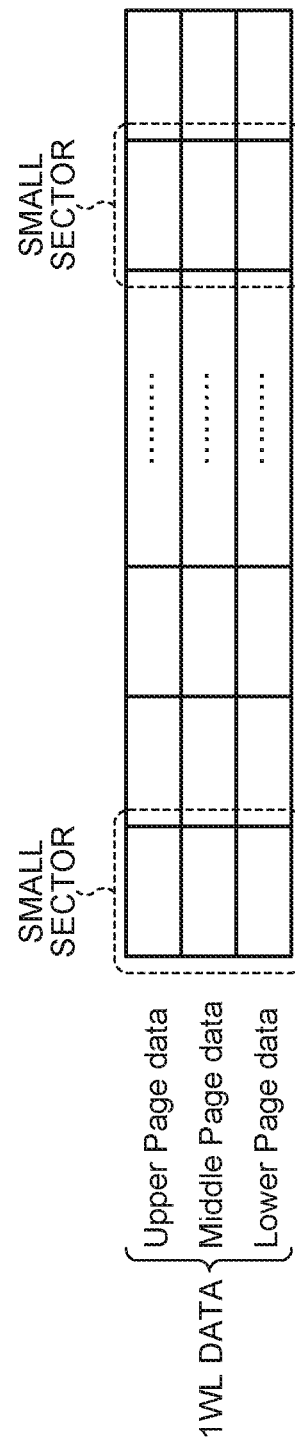
FIG. 4 is a diagram that illustrates a relation between one-word line data and a small sector.

FIG. 4 is a diagram that illustrates an example of a management unit of data processing performed by the error mitigating code unit 22. Data of N pages stored in one physical sector MS will be referred to as word line data (hereinafter, abbreviated as WL data). In the case of three bits/cell, 1 WL data includes lower page data Dl, middle page data Dm, and upper page data Du. The 1 WL data is divided into a plurality of small sectors having a certain data length. In other words, one physical sector MS includes a plurality of small sectors. Data of one small sector length is a unit for the data processing performed by the error mitigating code unit 22.

The ECC code unit 21 performs an error correction coding process for the write data WrData, thereby generating parity. The ECC code unit 21 inputs a code word EcData including the write data and the parity to the error mitigating code unit 22. The coding performed by the ECC code unit 21 may use any system. For example, Reed Solomon (RS) coding, Bose Chaudhuri Hocquenghem (BCH) coding, low density parity check (LDPC) coding, or the like may be used.

The error mitigating code unit 22 performs an error mitigating code process for the code words EcData and inputs data EmData after the process to the write unit 24. The error mitigating code process may be performed in units of small sector data including the lower page data Dl, the middle page data Dm, and the upper page data Du. Alternatively, the error mitigating code process may be performed in units of the lower page data, the middle page data, or the upper page data having a small sector length. Alternatively, the error mitigating code process may be performed for each one page data or each 1 WL data.

The error mitigating code process includes execution of a logical operation with a certain bit pattern for the code words EcData. In addition, the error mitigating code unit 22 adds a flag FG representing the content of the execution of the logical operation to a result of the execution of the logical operation. As the logical operation, for example, a flipping process of inverting input data or an exclusive OR operation with a certain bit pattern is employed. The flipping process is equivalent to the execution of an exclusive OR operation between a bit pattern having all the bits of "1" and input data.

In the case of N bits/cell, the error mitigating code unit 22 generates $2^N$ data translation candidates. In the case of two bits/cell, the error mitigating code unit 22 generates four data translation candidates. Four data translations include a first data translation not performing a flipping process for input data, a second data translation performing a flipping process only for the lower page data Dl of the input data, a third data translation performing a flipping process only for the upper page data Du of the input data, and a fourth data translation performing a flipping process for the lower page data Dl and the upper page data Du of the input data.

FIG. 5 is a diagram that illustrates data coding corresponding to eight data translations performed by the error mitigating code unit 22. In a left field of FIG. 5, pattern numbers #1 to #8 and flip patterns representing contents of data translations are illustrated. Here, U/M/L corresponds to upper page/middle page/lower page, respectively. In addition, "0" represents no flipping, and "1" represents flipping. For example, 0/1/1 represents that the upper page is not flipped, the middle page is flipped, and the lower page is flipped. In a middle field of FIG. 5, data after coding that is acquired by performing a flipping process for the input data EcData in accordance with the flipping pattern illustrated in the left field of FIG. 5 is illustrated. The input data EcData is "L3 L4 L2 L5 L1 L4 L6 L1". The input data "L3 L4 L2 L5 L1 L4 L6 L1" illustrates an example of data corresponding to three pages (the upper page, the middle page, and the lower page) written into eight cells. In a right field of FIG. 5, a flag FG is illustrated. The flag FG is represented as a threshold voltage distribution according to the data coding illustrated in FIG. 3. For example, when FG=L5, FG=0/1/0, and, when FG=L2, FG=1/0/1.

The error mitigating code unit 22, for example, for each small sector data, generates the eight data translation candidates #1 to #8 described above. The error mitigating code unit 22 selects one data translation candidate from the eight data translation candidates described above based on a certain selection rule. The selection rule, for example, includes selection of the candidate described above based on the number of the distributions L7 having a highest threshold voltage or the number of distributions Er having a lowest threshold voltage. For example, the selection rule selects a translation candidate having a smallest number of the distributions L7 or a translation candidate having a largest number of the distributions Er. In addition, the candidate may be selected based on the number of the distributions L7 and the distribution L6 having high threshold voltages. Alternatively, the selection rule includes selection of a candidate having a smallest number of adjacent data patterns for which the inter-cell interference described above can easily occur. The selection rule is merely an example, and any other arbitrary selection rule may be employed.

The error mitigating code unit 22 adds a flag FG representing a content of the data translation to the selected translation candidate. The error mitigating code unit 22 outputs data EmData including the flag FG to the write unit 24.

For example, it is assumed that the selection rule is to minimize the number of the distribution Er that is a distribution having a lowest threshold voltage and the number of the distribution L6 and the distribution L7 having high threshold voltages. In the case illustrated in FIG. 5, data "L3 L4 L2 L5 L1 L4 L6 L1" that is a translation candidate of #1 is selected, and a flag FG=L7=0/0/0 is added. Output data EmData also including the flag FG is "L3 L4 L2 L5 L1 L4 L6 L1 L7".

The write control unit 23 inputs a physical address WrPAddr of the NAND 10, which is acquired by translating the write address WrAddr input from the host I/F 4, to the write unit 24. The write control unit 23 registers L2P information representing the correspondence between the write address WrAddr and the physical address WrPAddr in the L2P translation table 45.

The write unit 24 outputs the data EmData input from the error mitigating code unit 22 to the NAND 10 together with the write physical address WrPAddr, thereby writing the data EmData into the NAND 10.

When a read address RdAddr is input from the host I/F 4, the read control unit 25 inputs a physical address RdPAddr, which is acquired by translating the read address RdAddr by using the L2P translation table 45, to the read unit 26. The read unit 26 reads data RData from a page of the NAND 10 that corresponds to the physical address RdPAddr. The read unit 26 inputs the read data RData to the error mitigating decode unit 27 and the check unit 28.

The error mitigating decode unit 27 performs a decoding process that is a reverse translation of the coding process performed by the error mitigating code unit 22. The error mitigating decode unit 27 performs a reverse translation process (reverse flipping process) of the read data RData based on the flag FG included in the read data RData. In other words, the error mitigating decode unit 27 determines whether the flag FG is "0" or "1" and determines whether or not the translation process (flipping process) has been performed for the read data RData. In a case where the flag FG represents that the translation process has been performed, the error mitigating decode unit 27 performs a reverse translation (flipping) of the read data RData. On the other hand, in a case where the flag FG represents that the translation process has not been performed, the error mitigating decode unit 27 does not perform a reverse translation of the read data RData.

The error mitigating decode unit 27 inputs the decoded data DmData to the error mitigating code unit 22 and the ECC decode unit 29. The error mitigating code unit 22 re-performs the error mitigating code process described above for the input data DmData. In other words, the error mitigating code unit 22 performs, by using the data DmData, the process of generating $2^N$ data translation candidates, the process of selecting one data translation candidate based on the same selection rule as that at the time of coding, and the process of adding the flag FG. The error mitigating code unit 22 inputs a re-performing result EData of the error mitigating decode process to the check unit 28.

The check unit 28 compares the read data RData with the re-performing result EData. The check unit 28 outputs a result of the comparison to the ECC decode unit 29 as check information. The check information includes information representing whether or not the result of the comparison includes a no-matching bit error, information representing the number of no-matching bits (the number of cells), and information representing no-matching bit positions (cell positions). In addition, in a case where a coding system such as the LDPC using a likelihood is employed by the ECC code unit 21, the check unit 28 outputs the check information including an initial value of a log likelihood ratio (LLR) set according to the check result to the ECC decode unit 29. At a bit position at which the comparison represents matching, a log likelihood ratio (LLR) representing that a likelihood of a bit value of "0" is high or a log likelihood ratio (LLR) representing that a likelihood of a bit value of "1" is high is initially set. At the bit position at which the comparison represents no matching, a log likelihood ratio (LLR) representing that the bit value has an indefinite level is initially set.

The ECC decode unit 29 performs an error correction decoding process for the data DmData by referring to the check information and outputs decoded data (read data) RdData to the host I/F 4. Since the ECC decode unit 29 can acquire information relating to a bit error from the check unit 28, the correction rate of the error correction is improved, and the bit error rate is enhanced.

A re-coding process and the like will be described with reference to FIG. 6. It is assumed that data "L3 L4 L2 L5 L1 L4 L6 L1 L7" of the pattern number #1 illustrated in FIG. 5 is written into the NAND 10. The data "L7" of the rearmost end is a flag FG. In addition, it is assumed that a read error occurs at the time of reading the data "L3 L4 L2 L5 L1 L4 L6 L1 L7", and the read unit 26 acquires "L3 L4 L2 L5 L1 L4 L6 L1 L6" as read data. This read data includes a bit error in which the flag FG bit "L7" is changed to "L6". The error mitigating decode unit 27 performs a reverse translation of the data "L3 L4 L2 L5 L1 L4 L6 L1" based on the flag FG=L6 and acquires data "L2 L5 L3 L4 Er L5 L7 Er". The error mitigating code unit 22 generates eight data translation candidates by using the data "L2 L5 L3 L4 Er L5 L7 Er". FIG. 6 illustrates the generated eight data translation candidates #11 to #18. The error mitigating code unit 22 selects one data translation candidate from among the data translation candidates #11 to #18 based on the selection rule of minimizing the number of the distribution Er, the distribution L6, and the distribution L7. In this case, "L4 L3 L5 L2 L6 L3 L1 L6 L1" that is the translation candidate #17 is selected. The check unit 28 compares "L4 L3 L5 L2 L6 L3 L1 L6 L1" that is the selected translation candidate #17 with "L3 L4 L2 L5 L1 L4 L6 L1 L6" that is the data RData acquired from the read unit 26. Since a result of the comparison represents no matching, the check unit 28 inputs the check information including the information representing no matching, the number of no-matching cells, the positions of the no-matching cells, and the like to the ECC decode unit 29.

Figure 7:
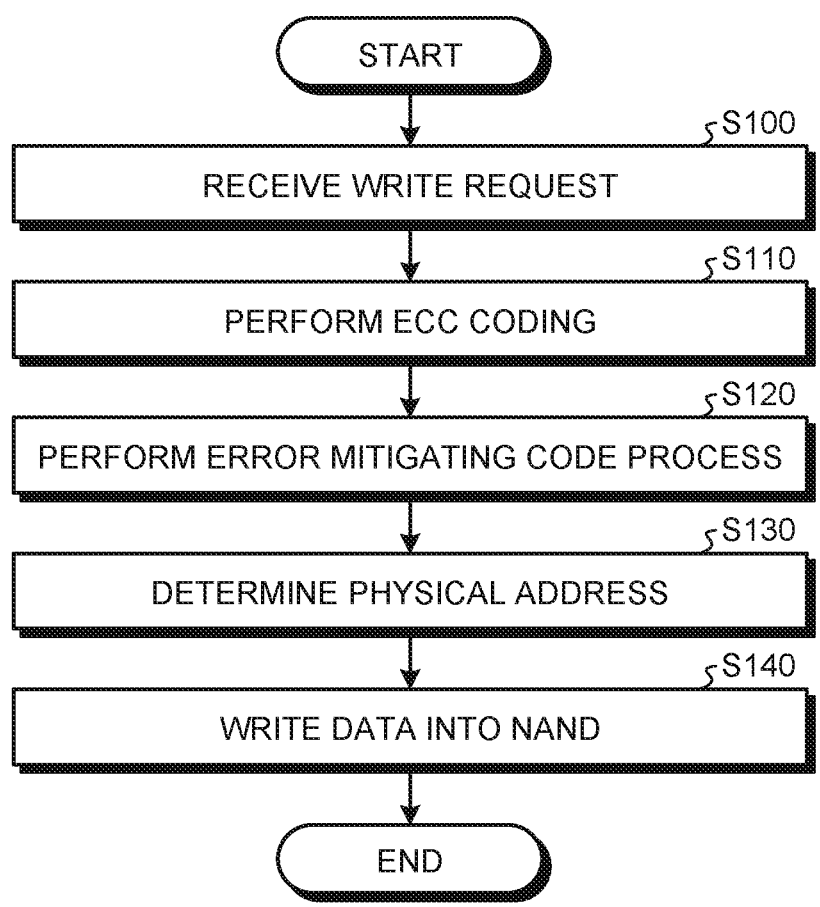
FIG. 7 is a flowchart that illustrates an example of the operation sequence of the memory system according to the first embodiment at the time of writing data.

Next, the operation sequence of the memory system 100 at the time of receiving a write request from the host 1 will be described along a flowchart illustrated in FIG. 7. When a write request is received through the host I/F 4 (S100), the ECC code unit 21 performs ECC coding of the write data WrData (S110) and outputs ECC-coded data EcData to the error mitigating code unit 22. The error mitigating code unit 22 performs an error mitigating code process of the data EcData based on the selection rule described above (S120) and outputs data EmData including the flag FG, for which the error mitigating code process has been performed, to the write unit 24. The write control unit 23 inputs a physical address WrPAddr, which is acquired by performing an address translation of the write address WrAddr, to the write unit 24 and registers L2P information in the L2P translation table 45 (S130). The write unit 24 outputs the data EmData to the NAND 10 together with the write physical address WrPAddr, thereby writing the data EmData into the NAND 10 (S140).

Figure 8:
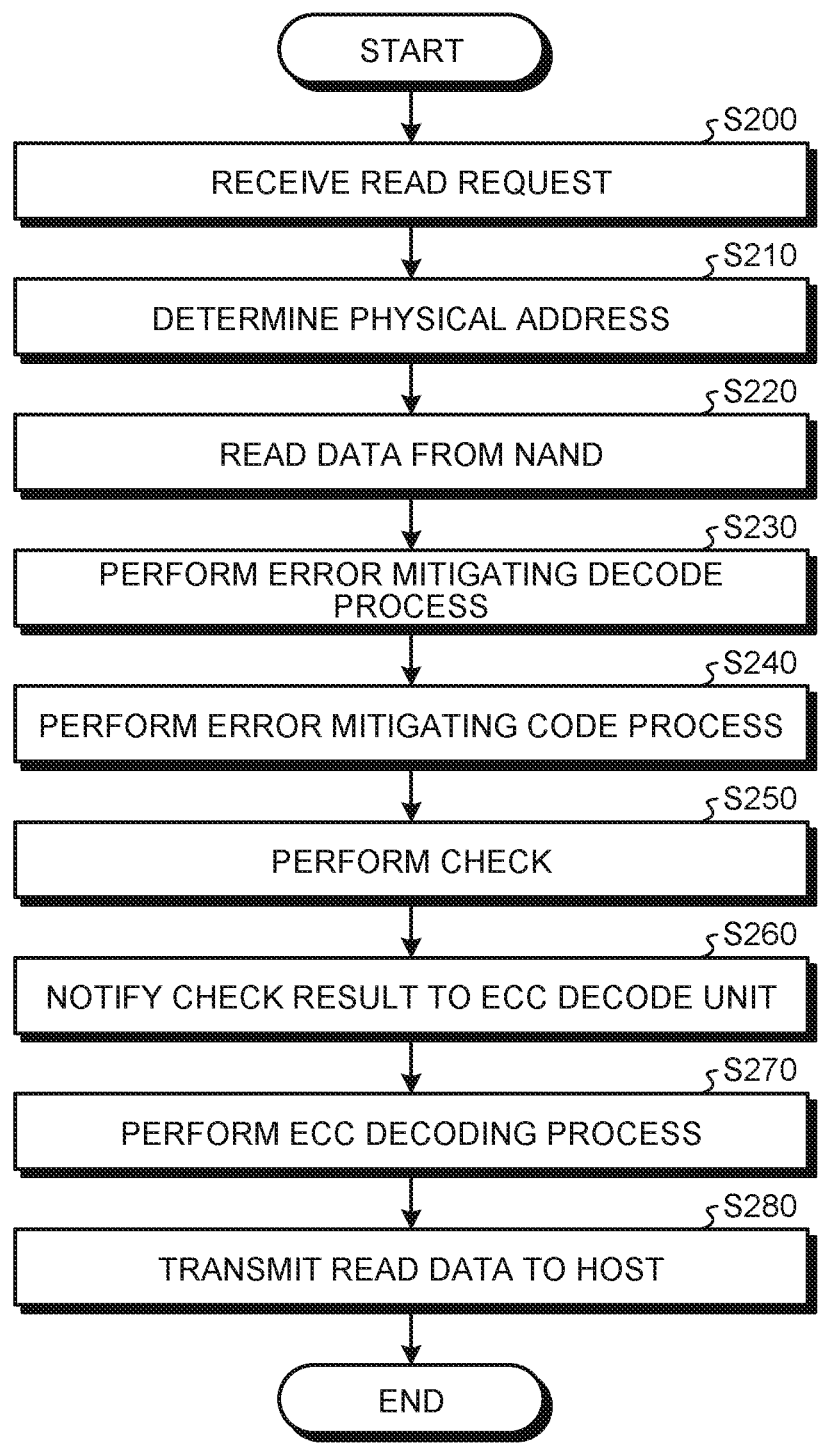
FIG. 8 is a flowchart that illustrates an example of the operation sequence of the memory system according to the first embodiment at the time of reading data.

Next, the operation sequence of the memory system 100 at the time of receiving a read request from the host 1 will be described along a flowchart illustrated in FIG. 8. When a read request is received through the host I/F 4 (S200), the read control unit 25 translates the read address RdAddr into a physical address RdPAddr by using the L2P translation table 45 (S210) and outputs the physical address RdPAddr to the read unit 26. The read unit 26 reads data RData from a page of the NAND 10 that corresponds to the physical address RdPAddr (S220). The error mitigating decode unit 27 performs a reverse translation of the coding process performed by the error mitigating code unit 22 (S230). The error mitigating code unit 22 re-performs the error mitigating code process of the reversely-translated data DmData based on the selection rule described above (S240). The check unit 28 compares the read data RData acquired from the read unit 26 with the data EData recoded by the error mitigating code unit 22 (S250). The check unit 28 inputs check information generated based on a result of the comparison to the ECC decode unit 29 (S260). The ECC decode unit 29 performs an error correction decoding process for the data DmData by referring to the check information (S270). The ECC decode unit 29 outputs the decoded data to the host I/F 4 as the read data RdData. The host I/F 4 transmits the read data RdData to the host 1 (S280).

In this way, according to the first embodiment, the error mitigating code process is re-performed for the data acquired by performing the error mitigating decode process for data read from the NAND 10, and the read data is compared with data for which the error mitigating code process is re-performed, whereby a bit error is detected. Since a result of the detection is used as side information at the time of performing ECC decoding, the error correction capability can be improved.

In addition, the re-coding process performed by the error mitigating code unit 22 and the comparison check performed by the check unit 28 may be configured to be performed only when the decoding process performed by the ECC decode unit 29 fails.

(Second Embodiment)

Figure 9:
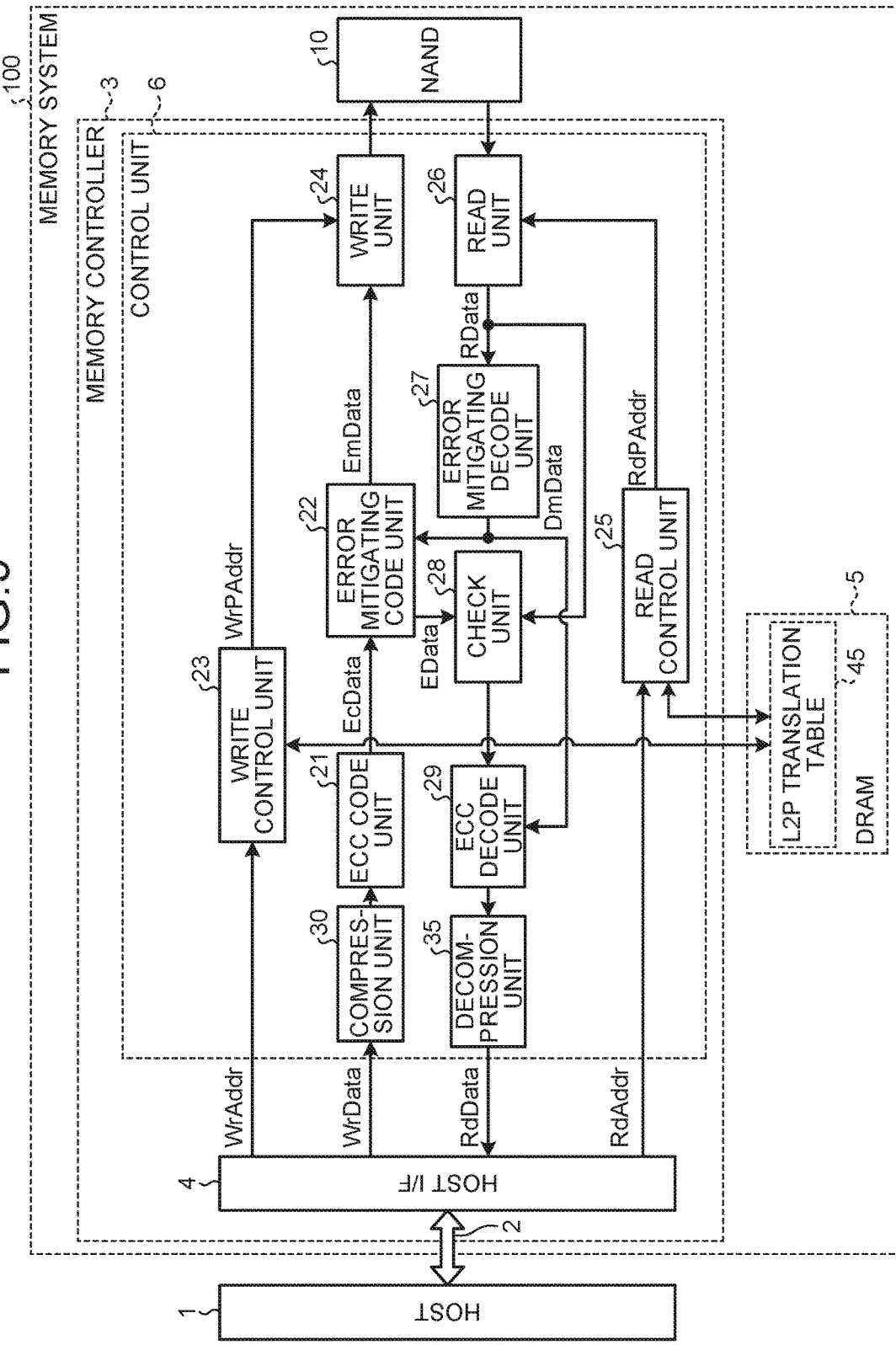
FIG. 9 is a functional block diagram that illustrates an example of the internal configuration of a memory system according to a second embodiment.

FIG. 9 is a block diagram that illustrates an example of the configuration of a memory system 100 according to a second embodiment. In the second embodiment, a compression unit 30 and a decompression unit 35 are added to the memory system according to the first embodiment.

The compression unit 30 performs lossless compression of write data WrData input from the host I/F 4, thereby generating compressed data. Through the compression, the number of bits of write data WrData is decreased. While a technique used for the compression is arbitrary, a technique capable of lossless compression is employed. The compression unit 30 may compress the write data WrData for each small sector length or for each one page data. When the compression of the write data WrData ends, the compression unit 30 calculates a compression rate. The compressed data is input to the ECC code unit 21. The compression rate is input to the error mitigating code unit 22. The ECC code unit 21 performs an error correction coding process for the compressed data and inputs a code word EcData including generated parity and the compressed data to the error mitigating code unit 22. The error mitigating code unit 22 performs the error mitigating code process for the data EcData and adds padding data. The length of the padding data is determined based on the compression rate so as to correspond to a length of data decreased by the compression. Thereafter, the write unit 24 writes data EmData output from the error mitigating code unit 22 into the NAND 10.

At the time of reading data, the error mitigating decode unit 27 removes the padding data from the data RData read from the NAND 10. The error mitigating decode unit 27 performs the error mitigating decode process for the read data from which the padding data is removed. The error mitigating code unit 22, the check unit 28, and the ECC decode unit 29 perform operations similar to those according to the first embodiment. The decompression unit 35 decompresses data by performing a data translation that is in the opposite direction of the compression process performed by the compression unit 30 and restores data input from the ECC decode unit 29 into the original write data WrData. The restored data is output to the host I/F 4 as read data RdData.

In the second embodiment, since the write data is compressed, the number of bits of the flag FG, which is increased according to the error mitigating code process, can be hidden.

(Third Embodiment)

Figure 10:
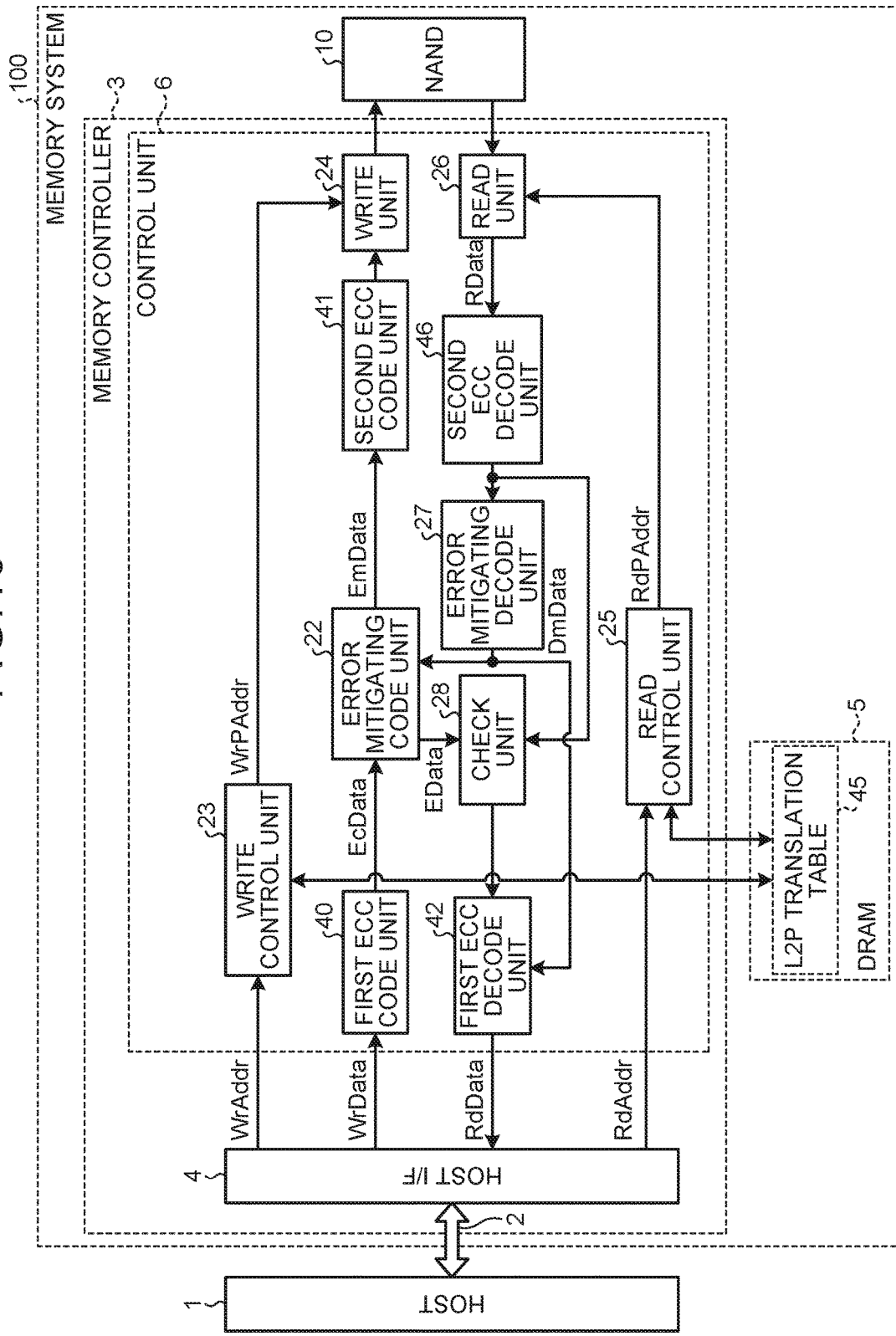
FIG. 10 is a functional block diagram that illustrates an example of the internal configuration of a memory system according to a third embodiment.

FIG. 10 is a block diagram that illustrates an example of the configuration of a memory system 100 according to a third embodiment. In the third embodiment, the ECC code unit 21 of the memory system according to the first embodiment is replaced with a first ECC code unit 40 and a second ECC code unit 41, and the ECC decode unit 29 is replaced with a first ECC decode unit 42 and a second ECC decode unit 46. In the first embodiment, the ECC code unit 21 is arranged to perform the ECC coding process before the process performed by the error mitigating code unit 22, and the ECC decode unit 29 is arranged to perform the ECC decoding process after the process performed by the error mitigating decode unit 27. However, in the third embodiment, the first and second ECC code units 40 and 41 are arranged to perform an ECC coding process before and after the process performed by an error mitigating code unit 22, and the second and first ECC decode units 46 and 42 are arranged to perform an ECC decoding process before and after the process performed by an error mitigating decode unit 27.

While the first and second ECC code units 40 and 41 may be configured to use a same coding system, it is preferable to set coding systems or data sizes configuring code words such that the error correction capability of the first ECC code unit 40 is higher than the error correction capability of the second ECC code unit 41. The first ECC decode unit 42 performs decoding corresponding to the coding performed by the first ECC code unit 40. The second ECC decode unit 46 performs decoding corresponding to the coding performed by the second ECC code unit 41. In addition, the second ECC code unit 41 and the second ECC decode unit 46 may be configured to perform an error correction of a flag FG generated by the error mitigating code unit 22 with a high priority level.

At the time of writing data, the first ECC code unit 40 performs first ECC coding for write data WrData. Next, the error mitigating code unit 22 performs the error mitigating code process described above for data after the first ECC coding. Next, the second ECC code unit 41 performs second ECC coding for data EmData. A write unit 24 writes data after the second ECC coding into a NAND 10.

At the time of reading data, the read unit 26 reads data RData from the NAND 10. The second ECC decode unit 46 performs second ECC decoding for the data RData. An error mitigating decode unit 27 performs a reverse translation of the coding process performed by the error mitigating code unit 22. The error mitigating code unit 22 re-performs the error mitigating code process for the reversely translated data DmData, thereby generating re-coded data EData. A check unit 28 compares the read data RData with the data EData. The check unit 28 inputs check information generated based on a result of the comparison to the first ECC decode unit 42. The second ECC decode unit 46 performs the first ECC decoding process for the data DmData by referring to the check information. The first ECC decode unit 42 outputs decoded data to a host I/F 4 as read data RdData. The host I/F 4 transmits the read data RdData to the host 1.

In the third embodiment, before the error mitigating decode process, since the error correction process is performed by the second ECC decode unit 46, the number of bit errors before the error mitigating decode process is decreased, and the patterns of bit errors are changed, whereby the accuracy of error detection performed by the check unit 28 is improved.

(Fourth Embodiment)

Figure 11:
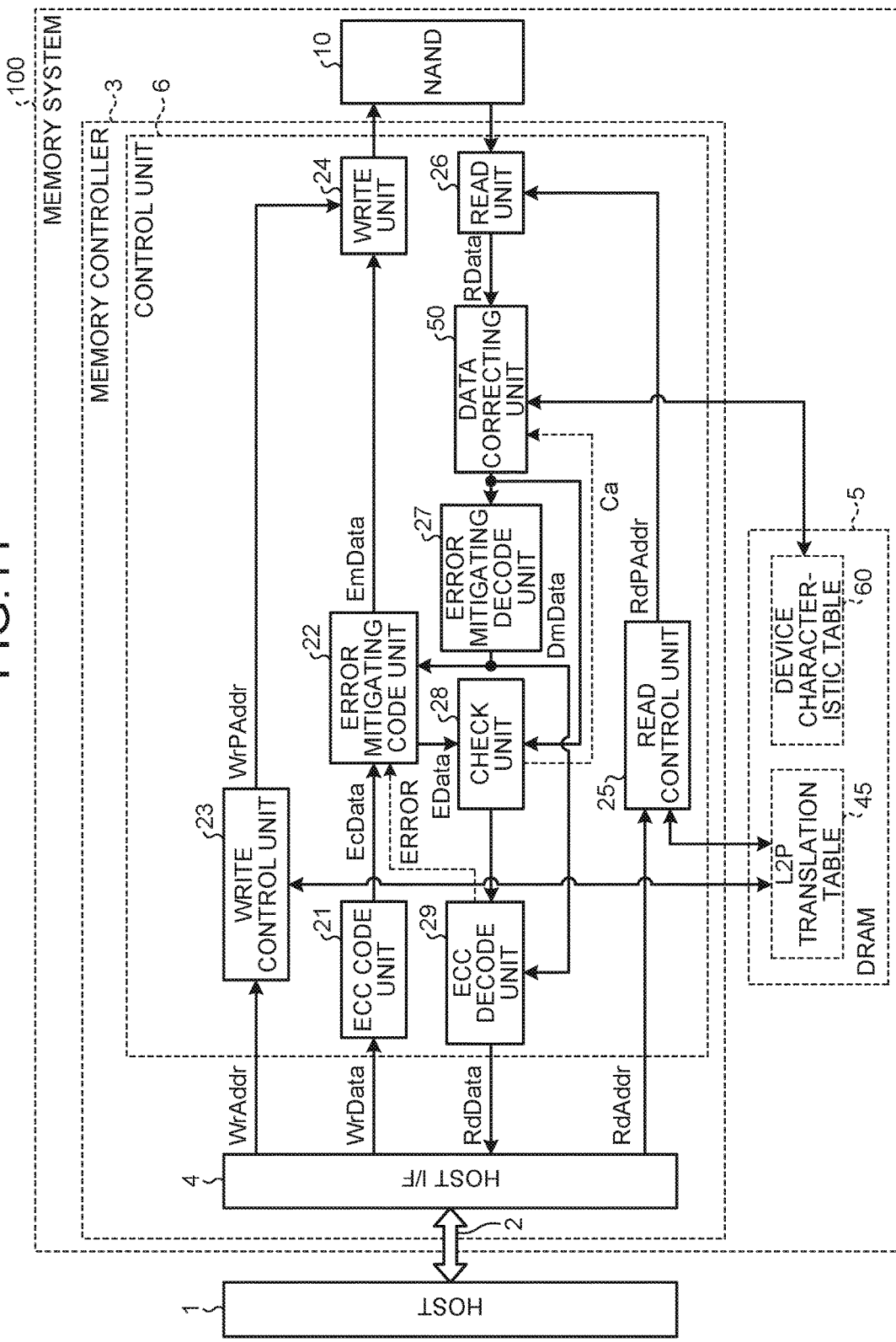
FIG. 11 is a functional block diagram that illustrates an example of the internal configuration of a memory system according to a fourth embodiment.

FIG. 11 is a block diagram that illustrates an example of the configuration of a memory system 100 according to a fourth embodiment. In the fourth embodiment, a data correcting unit 50 is arranged at a former stage of an error mitigating decode unit 27. In addition, a device characteristic table 60 in which device characteristics are stored as the management information described above is stored in a DRAM 5. The data correcting unit 50 estimates the content of a bit error based on the device characteristics and corrects data RData read from a NAND 10 based on the estimation.

In the device characteristic table 60, for example, device characteristics are registered for each physical sector MS. The device characteristics include information relating to a defective cell having a high occurrence rate of a bit error. The defective cell information includes information of positions of defective cells within a physical sector and information representing the content of an error. The information of the content of an error includes threshold distribution change information of a change of a certain threshold distribution to another threshold distribution. For example, the threshold distribution change information includes information of a change of the threshold distribution L7 to the threshold distribution L6, a change of the threshold distribution Er to the threshold distribution L1, and the like. The size for managing the device characteristics may be smaller than the physical sector, and, for example, the device characteristics may be managed in units of small sectors.

The data correcting unit 50 estimates the positions of bit errors and the contents of the errors based on the check information of the check unit 28 and the device characteristics of the device characteristic table 60 and corrects the data RData read from the NAND 10.

At the time of writing data, the ECC code unit 21 performs ECC coding for write data WrData. An error mitigating code unit 22 performs an error mitigating code process according to the selection rule for the data after the ECC coding. A write unit 24 writes the data after the error mitigating code process into the NAND 10.

Figure 12:
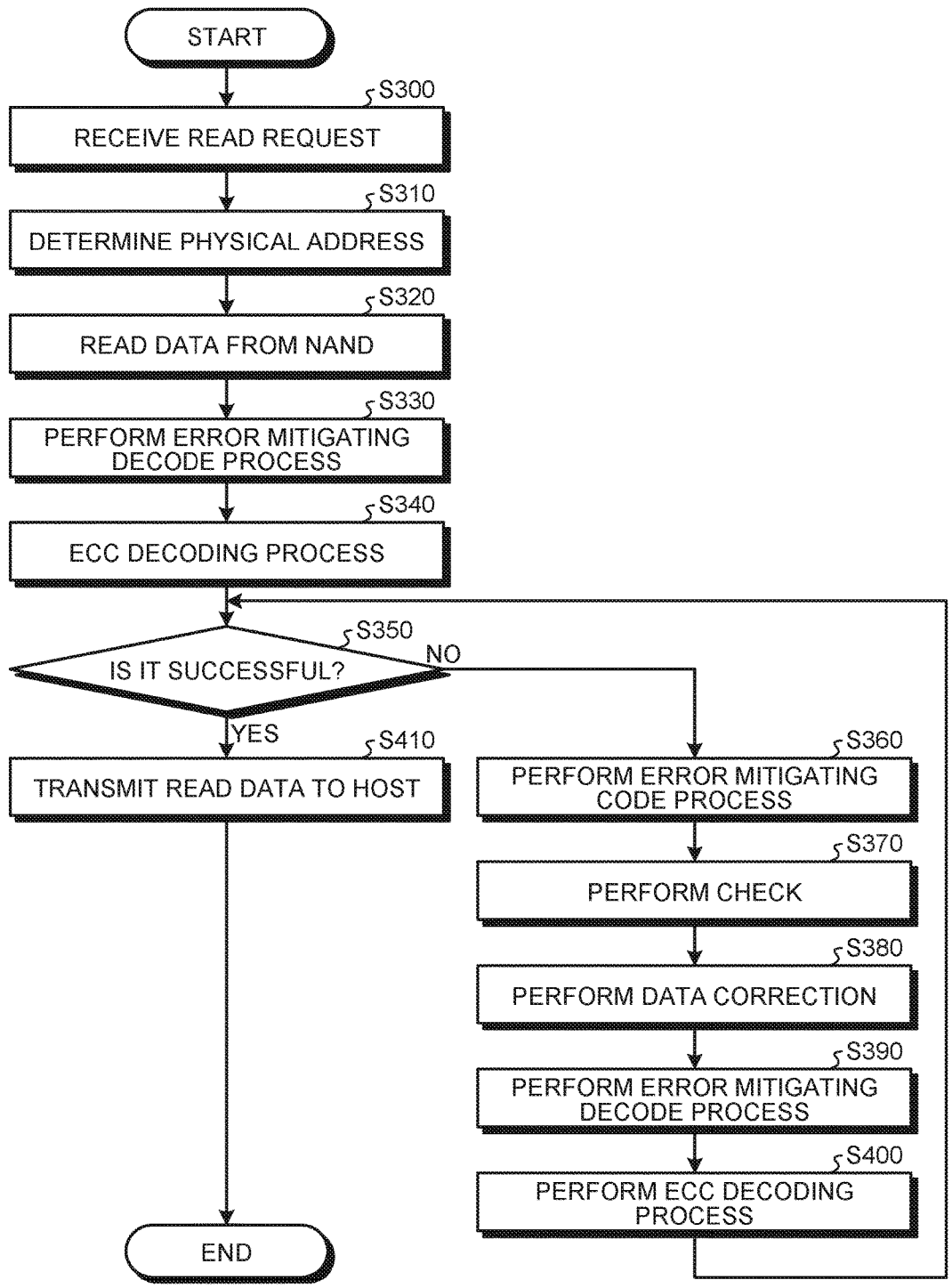
FIG. 12 is a flowchart that illustrates an example of the operation sequence of the memory system according to the fourth embodiment at the time of reading data.

FIG. 12 is a flowchart that illustrates the operation sequence of the memory system 100 according to the fourth embodiment at the time of receiving a read request from the host 1. When a read request is received from the host 1 through a host I/F 4 (S300), a read control unit 25 translates the read address RdAddr into a physical address RdPAddr by using the L2P translation table 45 (S310), and outputs the physical address RdPAddr to a read unit 26. The read unit 26 reads data RData from a page of the NAND 10 that corresponds to the physical address RdPAddr (S320). The read unit 26 inputs the data RData to the data correcting unit 50. The data correcting unit 50 performs a data correction in accordance with a data correction instruction Ca from the check unit 28. At this time, since the data correction instruction Ca is not asserted, the data correcting unit 50 does not perform a data correction, stores the data RData in an internal buffer memory, and inputs the data RData to the error mitigating decode unit 27. The error mitigating decode unit 27 performs the error mitigating decode process (S330), and inputs data DmData after the decode to the ECC decode unit 29. The ECC decode unit 29 performs ECC decoding of the data DmData (S340). In a case where the ECC decoding is successful (S350 Yes), the ECC decode unit 29 outputs the ECC decoded data to the host I/F 4 as read data RdData. The host I/F 4 transmits the read data RdData to the host 1 (S410).

On the other hand, in a case where the ECC decoding is not successful (S350 No), the ECC decode unit 29 notifies a failure to the error mitigating code unit 22. The error mitigating code unit 22 re-performs the error mitigating code process for the data DmData acquired from the error mitigating decode unit 27 based on the same selection rule as that at the time of writing data (S360), and inputs re-coded data EData to the check unit 28. The check unit 28 compares the read data RData acquired from the data correcting unit 50 with the data EData (S370). The check unit 28 generates check information including the information representing the number of no-matching bits (the number of cells), the information representing the no-matching bit positions (cell positions), and the like based on a result of the comparison and inputs the check information and the data correction instruction Ca to the data correcting unit 50.

When the data correction instruction Ca is received, the data correcting unit 50 acquires device characteristics of a physical sector MS in which the read data RData is stored from the device characteristic table 60. The data correcting unit 50 estimates the positions of bit errors based on the check information and the device characteristics and corrects a part of the bits of the data RData stored inside based on the estimation (S380). The data correcting unit 50 inputs corrected data to the error mitigating decode unit 27. The error mitigating decode unit 27 performs an error mitigating decode process for the corrected data (S390), and inputs data DmData after the decode to the ECC decode unit 29. The ECC decode unit 29 performs ECC decoding (S400) and determines whether the ECC decoding is successful. In a case where the ECC decoding is successful (S350 Yes), the ECC decode unit 29 outputs ECC-decoded data to the host I/F 4 as read data RdData.

On the other hand, in a case where the ECC decoding is not successful (S350 No), the ECC decode unit 29 notifies a failure to the error mitigating code unit 22 again. Thereafter, as described above, the error mitigating code process is performed (S370), the check is performed (S380), and the check information and the data correction instruction Ca are input from the check unit 28 to the data correcting unit 50. The data correcting unit 50 adds a new correction to the correction of the first time or performs a correction different from the correction of the first time and inputs corrected data to the error mitigating decode unit 27. The error mitigating decode unit 27 performs the error mitigating decode process for the corrected data (S390), and inputs data DmData after the decode to the ECC decode unit 29. The ECC decode unit 29 performs ECC decoding (S400) and determines whether or not the ECC decoding is successful. The process of S360 to S400 is repeated until the ECC decoding performed by the ECC decode unit 29 is successful or until a certain end condition is satisfied.

Figure 13:
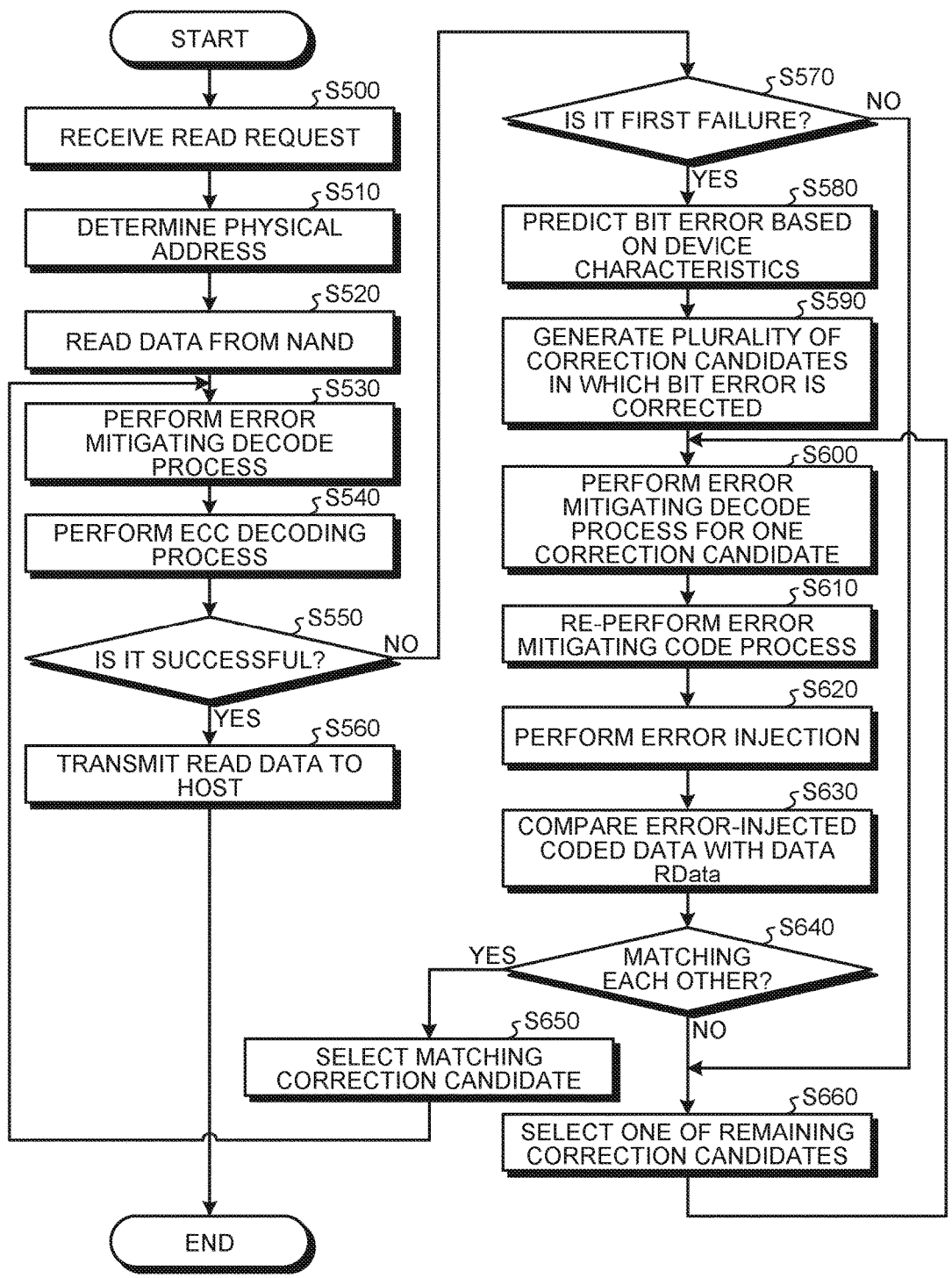
FIG. 13 is a flowchart that illustrates another example of the operation sequence of the memory system according to the fourth embodiment at the time of reading data.

Next, another operation sequence will be described with reference to FIG. 13. In the operation sequence illustrated in FIG. 12, the ECC decoding is performed each time one data correction candidate is selected. In the operation sequence illustrated in FIG. 13, some correction candidates having high possibilities of successful ECC decoding are selected, and ECC decoding is performed only for the selected correction candidates. In the operation sequence illustrated in FIG. 13, the data correcting unit 50 performs a data correcting process when a failure in the ECC decoding is notified from the ECC decode unit 29.

When a read request is received through the host I/F 4 (S500), the read control unit 25 translates the read address RdAddr into a physical address RdPAddr by using the L2P translation table 45 (S510), and outputs the physical address RdPAddr to the read unit 26. The read unit 26 reads data RData from a page of the NAND 10 that corresponds to the physical address RdPAddr (S520). The read unit 26 inputs the data RData to the data correcting unit 50. At this time, since a failure is not notified from the ECC decode unit 29, the data correcting unit 50 does not perform a data correction, stores the data RData in an internal buffer memory, and inputs the input data RData to the error mitigating decode unit 27. The error mitigating decode unit 27 performs an error mitigating decode process (S530), and inputs data DmData after the decode to the ECC decode unit 29. The ECC decode unit 29 performs ECC decoding (S540). In a case where the ECC decoding is successful (S550 Yes), the ECC decode unit 29 outputs ECC-decoded data to the host I/F 4 as read data RdData. The host I/F 4 transmits the read data RdData to the host 1 (S560).

On the other hand, in a case where the ECC decoding is not successful (S550 No), the ECC decode unit 29 notifies a failure to the data correcting unit 50. The data correcting unit 50 determines whether or not this notification of the failure is a first failure notification for the data Rdata read this time (S570). In the case of the first failure notification (S570 Yes), the data correcting unit 50 acquires device characteristics of a physical sector in which the data RData is stored from the device characteristic table 60. The data correcting unit 50 estimates a bit error of the data RData based on the device characteristics (S580).

It is assumed that data "L3 L4 L2 L5 L1 L4 L6 L1 L7" of the pattern number #1 illustrated in FIG. 5 is written into the NAND 10. The data "L7" of the rearmost end is a flag FG. In addition, it is assumed that a read error occurs at the time of reading the data "L3 L4 L2 L5 L1 L4 L6 L1 L7", and the read unit 26 acquires "L3 L4 L2 L5 L1 L4 L6 L1 L6" as read data RData. This read data RData includes a bit error in which the flag FG bit "L7" of the rearmost end is changed to "L6". It is assumed that the device information of a physical sector in which this read data is stored includes threshold distribution change information as below. The threshold distribution change information described above includes a fact that there is a possibility of the threshold distribution L7 being changed to the threshold distribution L6, there is a possibility of the threshold distribution Er being changed to the threshold distribution L1, and there is a possibility of the threshold distribution L6 being changed to the threshold distribution L5. The data correcting unit 50, based on this device information, estimates that data "L5" of a fourth bit, data "L1" of a fifth bit, data "L6" of a seventh bit, and the flag "L6" of a ninth bit of the data RData have possibilities of a bit error. The data correcting unit 50 estimates that there are possibilities of a change of the data "L5" of the fourth bit to "L6", a change of the data "L1" of the fifth bit to "Er", a change of the data "L6" of the seventh bit to "L7", and a change of the flag "L6" of the ninth bit to "L7".

The data correcting unit 50 generates a plurality of correction candidates including all the combinations in which the bit errors are corrected based on this estimation (S590).

In the example described above, since there is a possibility of errors in four bits, in this case, 15 ($=2^4 - 1$) correction candidates are generated. The 15 correction candidates #101 to #115 are represented as below. Data to which underline is applied is corrected data. In correction candidates #101 to #104, one bit is corrected. In correction candidates #105 to #111, two bits are corrected. In correction candidates #112 to #114, three bits are corrected. In a correction candidate #115, four bits are corrected.

| #101 | "L3 L4 L2 L6 L1 L4 L6 L1 L6" |
| #102 | "L3 L4 L2 L5 Er L4 L6 L1 L6" |
| #103 | "L3 L4 L2 L5 L1 L4 L7 L1 L6" |
| #104 | "L3 L4 L2 L5 L1 L4 L6 L1 L7" |
| #105 | "L3 L4 L2 L6 Er L4 L6 L1 L6" |
| #106 | "L3 L4 L2 L6 L1 L4 L7 L1 L6" |
| #107 | "L3 L4 L2 L6 L1 L4 L6 L1 L7" |
| #108 | "L3 L4 L2 L5 Er L4 L7 L1 L6" |
| #109 | "L3 L4 L2 L5 Er L4 L6 L1 L7" |
| #110 | "L3 L4 L2 L5 L1 L4 L7 L1 L7" |
| #111 | "L3 L4 L2 L5 L1 L4 L7 L1 L7" |
| #112 | "L3 L4 L2 L6 Er L4 L7 L1 L6" |
| #113 | "L3 L4 L2 L6 Er L4 L6 L1 L7" |
| #114 | "L3 L4 L2 L5 Er L4 L7 L1 L7" |
| #115 | "L3 L4 L2 L6 Er L4 L7 L1 L7" |

The data correcting unit 50 inputs one correction candidate to the error mitigating decode unit 27. The error mitigating decode unit 27 performs a reverse translation process (reverse flipping process) for the correction candidate based on the flag FG included in the input correction candidate (S600).

The error mitigating code unit 22 performs the error mitigating code process according to the selection rule described above for the reversely-translated correction candidate (S610). In other words, the error mitigating code unit 22 generates a plurality of data translation candidates and selects one data translation candidate from among the plurality of data translation candidates based on the selection rule described above. In addition, the error mitigating code unit 22 performs an error injecting process (S620). The error injecting process is returning, to the original data, corrected data when correction candidates are generated. For example, in the correction candidate #103, since the data of the seventh bit is corrected from "L6" to "L7", "L7" is returned to "L6" through the error injecting process. In addition, in the correction candidate #114, since the flag of the ninth bit is corrected from "L6" to "L7", "L7" is returned to "L6"

through the error injecting process. The error mitigating code unit 22 inputs the error-injected coded output to the check unit 28.

The check unit 28 acquires the data RData before the correction from the data correcting unit 50 and compares the data RData with the error-injected coded output (S630). In a case where a result of the comparison represents matching (S640 Yes), the check unit 28 notifies the matching of the check result to the data correcting unit 50. In addition, the check unit 28 inputs check information including bit error positions, likelihood information including a likelihood of each bit, and the like to the ECC decode unit 29 as side information. Then, the data correcting unit 50 outputs a matching correction candidate to the error mitigating decode unit 27 (S650).

The error mitigating decode unit 27, based on the flag FG included in the input correction candidate, performs a reverse translation process (reverse flipping process) for the input data (S530) and inputs data DmData after the reverse translation to the ECC decode unit 29. The ECC decode unit 29 performs ECC decoding by referring to the check information (S540), and determines whether or not the ECC decoding is successful (S550). In a case where the ECC decoding is successful (S550 Yes), the ECC decode unit 29 outputs the ECC-decoded data to the host I/F 4 as read data RdData. The host I/F 4 transmits the read data RdData to the host 1 (S560).

In a case where the ECC decoding is not successful (S550 No), the ECC decode unit 29 notifies a failure to the data correcting unit 50. The data correcting unit 50 determines whether or not this failure notification is a first failure notification for the data Rdata read this time (S570). In this case, since the failure notification is not the first failure notification (S570 No), the data correcting unit 50 selects a next correction candidate from among the remaining correction candidates (S660), and inputs the selected one correction candidate to the error mitigating decode unit 27. Thereafter, the process of S600 to S640 described above is performed.

On the other hand, in a case where the result of the comparison represents no matching (S640 No), the check unit 28 notifies no-matching to the data correcting unit 50. The data correcting unit 50 selects a next correction candidate from among the remaining correction candidates (S660), and inputs the selected one correction candidate to the error mitigating decode unit 27. Thereafter, the process of S600 to S640 described above is performed.

In this way, the process of S570 to S660, S530, and S540 is repeated until the ECC decoding performed by the ECC decode unit 29 is successful in S550 or until a certain end condition is satisfied. In addition, in the comparison process of S630 and S640, in a case where the results of the comparison for all the correction candidates represent no matching, a correction candidate of which the number of no-matching bits is smallest in the comparison process of S630 is selected.

In the example described above, for the correction candidate #103 and the correction candidate #104 among the correction candidates #101 to #115, a result of the comparison process, which is performed by the check unit 28, representing matching is acquired, and ECC decoding is performed for these two correction candidates by the ECC decode unit 29. In this case, as a result, the correction candidate #104 is successful in the ECC decoding.

In addition, in the example described above, bit errors are estimated based on the device characteristics, and the read data RData read from the NAND 10 is corrected based on the estimation. However, without correcting the read data RData, all the estimated errors may be notified to the ECC decode unit 29. In other words, in this case, the data correcting unit 50 or the check unit 28 inputs check information including estimated bit error positions, likelihood information including a likelihood of each bit, and the like to the ECC decode unit 29 as side information.

In this way, according to the fourth embodiment, the contents of bit errors are estimated based on the device characteristics, the read data RData is corrected based on the estimation, and data after the correction is input to the ECC decode unit 29. Accordingly, the success rate of the error correction performed by the ECC decode unit 29 can be improved, and the bit error rate can be decreased.

In addition, in the third embodiment or the fourth embodiment, the compression unit 30 and the decompression unit 35 described in the second embodiment may be added. Furthermore, it may be configured such that the ECC code unit 21 according to the fourth embodiment is replaced with the first ECC code unit 40 and the second ECC code unit 41 described in the third embodiment, and the ECC decode unit 29 according to the fourth embodiment is replaced with the first ECC decode unit 42 and the second ECC decode unit 46 described in the third embodiment. In addition, in the first to third embodiments, the device characteristic table 60 may be arranged. The error mitigating code unit 22 may perform the error mitigating code process by referring to the device characteristics of a data write destination.

In addition, in the description presented above, at the time of reading data, while the error mitigating code unit 22, the error mitigating decode unit 27, the check unit 28, and the data correcting unit 50 perform the processes in units of the threshold voltage distributions, the process of each of the error mitigating code unit 22, the error mitigating decode unit 27, the check unit 28, and the data correcting unit 50 may be performed in units of one page data. For example, in the case of three bits/cell, the process in each of the error mitigating code unit 22, the error mitigating decode unit 27, the check unit 28, and the data correcting unit 50 is performed in units of the lower page data, in units of the middle page data, and in units of the upper page data.

Furthermore, in the first to fourth embodiments described above, while threshold voltage distributions of eight values have been illustrated, the first to fourth embodiments may be applied to a memory having threshold voltage distributions of two values, four values, 16 values, or more. In addition, for data coding of multi-value memory cells, while one type of data coding relating to eight values has been illustrated, the first to fourth embodiments may be applied to any other arbitrary data coding.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller controlling a nonvolatile memory, the memory controller comprising:
  a read unit that reads first data from the nonvolatile memory, the first data being data for which a first data translation is performed, the first data translation being a process that is different from an error correction coding process, the first data translation being a process that is different from an error correction decoding process;
a second data translation unit that performs a second data translation for the read first data, the second data translation being a reverse translation of the first data translation;
a first data translation unit that performs the first data translation for the first data for which the second data translation is performed; and
a check unit that compares the read first data with the first data for which the first data translation is performed by the first data translation unit and generates check information based on a result of the comparison.

2. The memory controller according to claim 1, wherein the first data is data for which the error correction coding process and the first data translation are performed, and the memory controller further comprises a decode unit that performs the error correction decoding process, by referring to the check information, for the first data for which the second data translation is performed.

3. The memory controller according to claim 2, wherein, in a case where the decoding process performed by the decode unit fails, the first data translation unit performs the first data translation, and the check unit performs the comparison and the generation of the check information.

4. The memory controller according to claim 1,
wherein the first data translation includes execution of a certain logical operation for the first data and addition of identification information representing a content of the execution of the logical operation to the first data, and
wherein the second data translation includes performing a reverse translation of the certain logical operation for the read first data based on the identification information.

5. The memory controller according to claim 2, further comprising:
a data correcting unit that estimates a bit error based on device characteristics of a first area of the nonvolatile memory and corrects the read first data, the first area being an area in which the read first data is stored,
wherein the second data translation unit acquires second data by performing the second data translation for the corrected first data, and
wherein the decode unit performs the error correction decoding process for the second data.

6. The memory controller according to claim 5,
wherein, in a case where the decoding process performed by the decode unit fails, the data correcting unit performs the correction process,
wherein the first data translation unit acquires third data by performing the first data translation for the second data,
wherein the check unit acquires fourth data by performing a reverse process of the correction performed by the data correcting unit for the third data, compares the fourth data with the read first data, and, in a case where a result of the comparison represents matching, outputs the corrected first data to the decode unit, and
wherein the decode unit performs the error correction decoding process for the corrected first data.

7. The memory controller according to claim 4, wherein the logical operation is executed for each first management unit, the identification information is added in correspondence with data of the first management unit, and the first management unit has a certain length acquired by dividing the physical sector into a plurality of parts.

8. The memory controller according to claim 1, wherein the check information includes a number of bit errors determined to be no matching through the comparison, positions of the bit errors, or a likelihood of each bit of the read first data.

9. The memory controller according to claim 1,
wherein the first data is data for which a first error correction coding process, the first data translation, and a second error correction coding process are performed in order of the first error correction coding process, the first data translation, and the second error correction coding process,
the memory controller further comprises a second decode unit that performs a second error correction decoding process for the read first data, the second error correction decoding process being a decoding process corresponding to the second error correction coding process,
wherein the second data translation unit performs the second data translation for the first data for which the second error correction decoding process is performed, and
the memory controller further comprising a first decode unit that performs a first error correction decoding process for the first data for which the second data translation is performed by referring to the check information, the first error correction decoding process being a decoding process corresponding to the first error correction coding process.

10. The memory controller according to claim 2, wherein the first data is data for which a compression process and the first data translation are performed, and the memory controller further comprises a decompression unit that decompresses the first data for which the error correction decoding process is performed.

11. A memory system comprising:
a nonvolatile memory; and
a memory controller including:
a read unit that reads first data from the nonvolatile memory, the first data being data for which a first data translation is performed, the first data translation being a process that is different from an error correction coding process, the first data translation being a process that is different from an error correction decoding process;
a second data translation unit that performs a second data translation for the read first data, the second data translation being a reverse translation of the first data translation;
a first data translation unit that performs the first data translation for the first data for which the second data translation is performed; and
a check unit that compares the read first data with the first data for which the first data translation is performed by the first data translation unit and generates check information based on a result of the comparison.

12. The memory system according to claim 11,
wherein the first data is data for which the error correction coding process and the first data translation are performed, and
wherein the memory controller further includes a decode unit that performs the error correction decoding process for the first data for which the second data translation is performed by referring to the check information.

13. The memory system according to claim 12, wherein, in a case where the decoding process performed by the decode unit fails, the first data translation unit performs the first data translation, and the check unit performs the comparison and the generation of the check information.

14. The memory system according to claim 11,
wherein the first data translation includes execution of a certain logical operation for the first data and addition of identification information representing a content of the execution of the logical operation to the first data, and
wherein the second data translation includes performing a reverse translation of the certain logical operation for the read first data based on the identification information.

15. The memory system according to claim 12,
wherein the memory controller further includes a data correcting unit that estimates a bit error based on device characteristics of a first area of the nonvolatile memory and corrects the read first data, the first area being an area in which the read first data is stored,
wherein the second data translation unit acquires second data by performing the second data translation for the corrected first data, and
wherein the decode unit performs the error correction decoding process for the second data.

16. The memory system according to claim 15,
wherein, in a case where the decoding process performed by the decode unit fails, the data correcting unit performs the correction process,
wherein the first data translation unit acquires third data by performing the first data translation for the second data,
wherein the check unit acquires fourth data by performing a reverse process of the correction performed by the data correcting unit for the third data, compares the fourth data with the read first data, and, in a case where a result of the comparison represents matching, outputs the corrected first data to the decode unit, and
wherein the decode unit performs the error correction decoding process for the corrected first data.

17. The memory system according to claim 14, wherein the logical operation is executed for each first management unit, the identification information is added in correspondence with data of the first management unit, and the first management unit has a certain length acquired by dividing the physical sector into a plurality of parts.

18. The memory system according to claim 11, wherein the check information includes a number of bit errors determined to be no matching through the comparison, positions of the bit errors, or a likelihood of each bit of the read first data.

19. The memory system according to claim 11,
wherein the first data is data for which a first error correction coding process, the first data translation, and a second error correction coding process are performed in order of the first error correction coding process, the first data translation, and the second error correction coding process,
the memory controller further comprising a second decode unit that performs a second error correction decoding process for the read first data, the second error correction decoding process being a decoding process corresponding to the second error correction coding process,
wherein the second data translation unit performs the second data translation for the first data for which the second error correction decoding process is performed,
the memory controller further comprising a first decode unit that performs a first error correction decoding process for the first data for which the second data translation is performed by referring to the check information, the first error correction decoding process being a decoding process corresponding to the first error correction coding process.

20. The memory system according to claim 12,
wherein the first data is data for which a compression process and the first data translation are performed, and
wherein the memory controller further includes a decompression unit that decompresses the first data for which the error correction decoding process is performed.

* * * * *